United States Patent
Ryhänen et al.

(10) Patent No.: US 7,606,400 B2
(45) Date of Patent: Oct. 20, 2009

(54) ARRANGEMENT FOR AUTHENTICATION OF A PERSON

(75) Inventors: Tapani Ryhänen, Helsinki (FI); Kari Hjelt, Espoo (FI)

(73) Assignee: Nokia Corporation, Espoo (FI)

(*) Notice: Subject to any disclaimer, the term of this patent is extended or adjusted under 35 U.S.C. 154(b) by 1195 days.

(21) Appl. No.: 10/763,821

(22) Filed: Jan. 22, 2004

(65) Prior Publication Data

US 2005/0031174 A1 Feb. 10, 2005

(30) Foreign Application Priority Data

Jan. 22, 2003 (FI) ................................. 20030102

(51) Int. Cl.
*G06K 9/00* (2006.01)
(52) U.S. Cl. .................. 382/124; 382/115; 361/280; 361/760; 324/661
(58) Field of Classification Search ................ 382/115, 382/124–127; 29/810–841; 361/760
See application file for complete search history.

(56) References Cited

U.S. PATENT DOCUMENTS

| | | | | |
|---|---|---|---|---|
| 4,577,345 | A * | 3/1986 | Abramov | 382/124 |
| 5,862,248 | A * | 1/1999 | Salatino et al. | 382/124 |
| 5,887,343 | A | 3/1999 | Salatino et al. | 29/833 |
| 6,055,324 | A | 4/2000 | Fujieda | 382/124 |
| 6,067,368 | A | 5/2000 | Setlak et al. | 382/124 |
| 6,088,585 | A | 7/2000 | Schmitt et al. | 455/411 |
| 6,289,114 | B1 * | 9/2001 | Mainguet | 382/124 |
| 6,327,376 | B1 * | 12/2001 | Harkin | 382/124 |
| 6,643,389 | B1 * | 11/2003 | Raynal et al. | 382/124 |
| 7,099,496 | B2 * | 8/2006 | Benkley, III | 382/124 |
| 7,251,351 | B2 * | 7/2007 | Mathiassen et al. | 382/124 |
| 2002/0014651 | A1 | 2/2002 | Thomas | 257/312 |
| 2003/0210809 | A1 * | 11/2003 | Kim | 382/124 |

FOREIGN PATENT DOCUMENTS

| | | |
|---|---|---|
| EP | 1073117 A2 | 1/2001 |
| JP | 6-104641 | 4/1994 |
| JP | 06104641 A * | 4/1994 |
| JP | 2001-184490 | 7/2001 |

(Continued)

OTHER PUBLICATIONS

U.S. Appl. No. 10/763,805, filed Jan. 22, 2004, Title: Improved Sensing Arrangement, Applicant: Ryhänen et al.

(Continued)

*Primary Examiner*—Matthew C Bella
*Assistant Examiner*—Eric Rush

(57) ABSTRACT

A capacitive fingerprint sensor is fabricated on a plastic substrate (363) with an embedded integrated circuit chip (380). The invention describes a way to create two or three dimensional forms for electrode structures (321, 322, 325, 365, 366) that can be used to optimize the performance of the sensor. When the three dimensional structure is designed to follow the shape of a finger, a very small pressure is required when sliding the finger along the sensor surface. This way the use of the sensor is ergonomic and the measurement is made very reliable. The inventive fabrication method describes the way, how to connect and embed an integrated circuit containing measurement electronics with a batch processed larger scale electrode configuration that is used for capturing the capacitive image of the fingerprint.

41 Claims, 12 Drawing Sheets

FOREIGN PATENT DOCUMENTS

| | | |
|---|---|---|
| JP | 2003-16433 | 1/2003 |
| JP | 2003-536085 | 12/2003 |
| WO | WO 01/06448 A1 | 1/2001 |
| WO | 01/99035 | 12/2001 |
| WO | WO 01/99035 A2 | 12/2001 |
| WO | WO 01/99036 A2 | 12/2001 |

OTHER PUBLICATIONS

U.S. Appl. No. 10/760,146, filed Jan. 16, 2004, Title: A Finger-Controllable Multi-Directional Switch, Applicant: Chung Kin Lau.

Japanese Office Action dated Sep. 27, 2007, 4 pages English translation and 2 pages Japanese original.

* cited by examiner

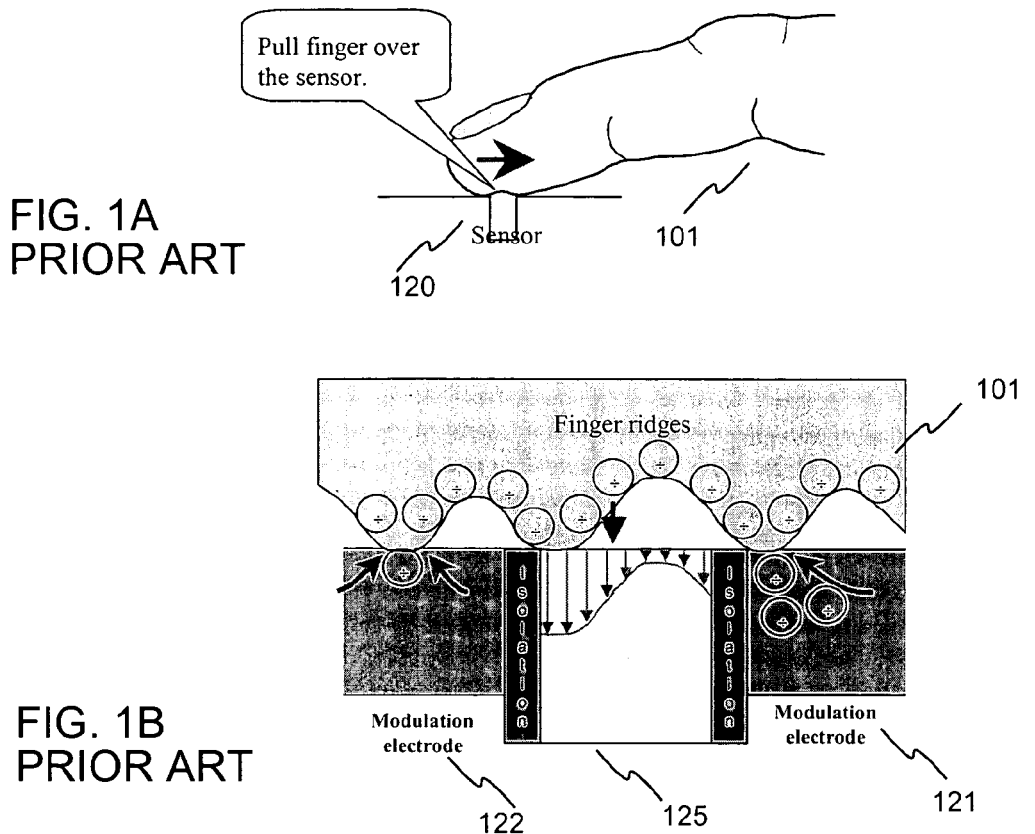
FIG. 1A PRIOR ART
FIG. 1B PRIOR ART
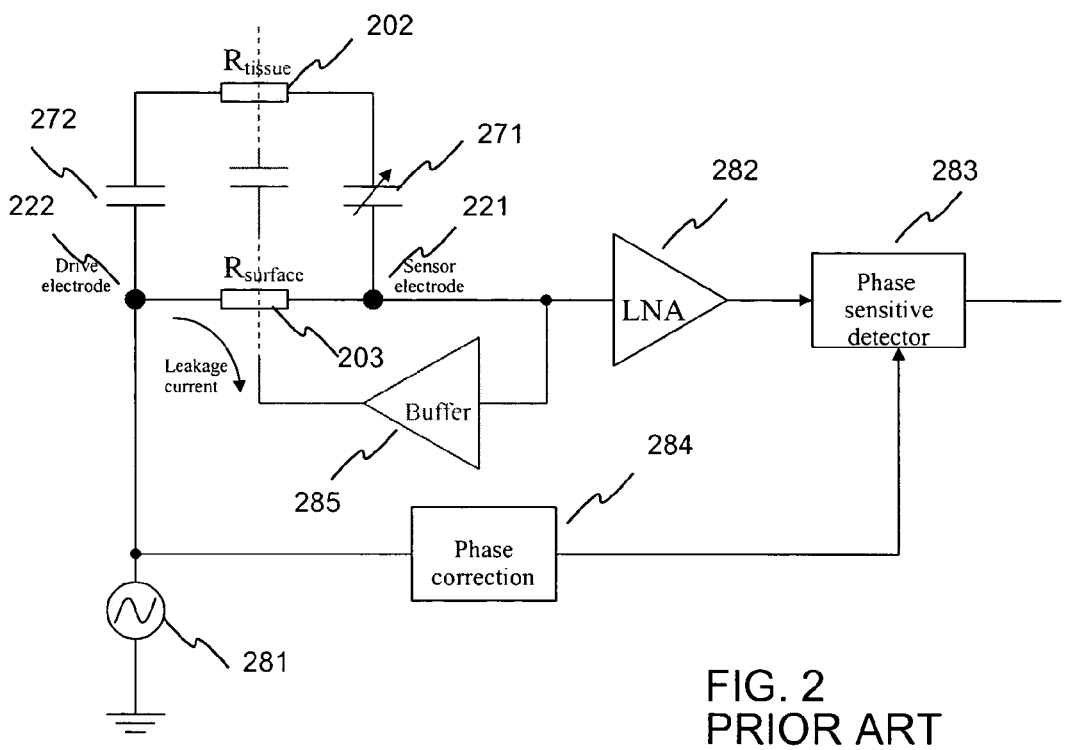
FIG. 2 PRIOR ART

160

161

162

163

164

165

166

167

168

169

170

171

172

173

174

175

176

177

178

179

ARRANGEMENT FOR AUTHENTICATION
OF A PERSON

CROSS REFERENCE TO RELATED
APPLICATION

This application claims priority from Finnish application serial number 20030102 filed Jan. 22, 2003.

TECHNICAL FIELD OF THE INVENTION

The invention relates to an arrangement for authentication of a person, for example for authentication of a user of a mobile terminal. In particular the invention relates to a fingerprint sensor arrangement. The invention also relates to a manufacturing method of the inventive fingerprint sensor.

BACKGROUND ART OF THE INVENTION

There is a need of providing sensors in mobile terminals in order to make the mobile terminal capable of sensing its ambient conditions. The information can be used for context awareness applications where the ambient information is used for controlling the user interface profile and different settings of the mobile terminal user interface. Fingerprint sensors are also needed for authenticating the user of the terminal.

There exist several kinds of fingerprint sensors: skin impedance based sensor, thermal sensors, and optical sensors. The most practical solution for authentication of a user of small appliances, such as mobile terminals, is based on capacitive impedance measurement. The basic idea of the capacitive fingerprint sensor to measure the change of skin impedance is described in FIGS. 1A and 1B. An array of sensors 120 measure the skin impedance values when a finger 101 is gradually pulled over the array of sensors. The capacitance between the electrode surface and the conductive saline layer inside the skin surface varies as a function of distance to the conductive layer. The varying air gap and the dead horny cells in the surface of the skin form the capacitance 125 to the conductive layers 121, 122 forming the electrodes of the capacitive sensor.

FIG. 2 shows a rough equivalent circuit of the skin impedance and the impedance measurement principle. Skin has a fixed resistive tissue component 202, and a fixed resistive surface component 203. The measurement capacitance also has a fixed component 272 and a component 271 that varies according to the surface form of the finger. The capacitive fingerprint sensor measures the varying capacitive component by applying an alternating voltage 281 to a drive electrode 222 and measuring a signal from a sensor electrode 221. The signal is amplified with a low noise amplifier 282, and the phase difference between driver and sensing electrodes is measured, 283. Interference can be suppressed with a guard electrode, which is kept in the same potential as the signal input using a buffer 285.

A fingerprint sensor also requires a signal processing circuit, which is preferably a silicon-based integrated circuit. One solution for providing a fingerprint sensor would be to use an integrated circuit, which would serve both as capacitive measurement electrodes and as signal processing electronics. This integrated circuit would then be mounted on the surface of the appliance. However, the area needed for the capturing the capacitive image of the fingerprint is roughly in the scale of one square centimeter. This is a very large area for using a silicon integrated circuit as measurement electrodes. Furthermore, the measurement consists of hundreds of capacitive pixels that are arranged in a row or in a matrix depending on the measurement principle. A lot of wiring is needed and the measurement electrodes need to be isolated from the integrated circuits. Therefore a cost efficient method for connecting the capacitive electrodes to the signal processing silicon integrated circuit is needed.

One typical prior art solution is described in patent documents U.S. Pat. No. 5,887,343 and U.S. Pat. No. 6,067,368. The problem is solved by using a separate insulating planar substrate to form the measurement electrode. This substrate contains the interconnecting wiring and the vias through the substrate. The substrate is connected to the silicon integrated circuit containing the signal and data processing capabilities. However, this solution is complicated to manufacture because a large number of interconnecting wiring must be connected within a small space. Such wiring also is not very robust, which tends to make the structure easy to break in mobile use.

Another prior art solution is to create the measurement electrodes directly on top of the silicon wafer. This leads to a simple configuration of interconnecting wiring but the solution requires a large silicon surface due to the large area needed for the electrodes.

The prior art solutions also have a disadvantage that relates to security. It is possible to make external connections to the wiring between the capacitive measurement electrodes and the integrated circuit, and by using such a connection it is possible to "record" signals that relate to a certain finger when the finger is measured. It is then later possible to input these recorded signals to the integrated circuit and thus a positive authentication result can be achieved electrically without any finger.

A further disadvantage with the prior art solutions relates to the ergonomics of the sensor. A finger must be pressed rather heavily against the flat sensor in order to achieve sufficient contact area between the sensor and the finger. Therefore the measurement may often fail when the finger is not pressed and slid properly along the sensor surface.

SUMMARY OF THE INVENTION

The purpose of the invention is to provide a capacitive fingerprint sensor with improvements related to the aforementioned disadvantages. The invented arrangement for fingerprint measurement facilitates good suitability to serial production, good security properties and ergonomics. Hence, the invention presents a substantial improvement to the cost efficiency and reliability of the fingerprint sensors, especially in mobile applications.

A fingerprint sensor arrangement according to the present invention, comprising at least one driver electrode and at least one sensor electrode for a capacitive measurement, and an integrated signal processing circuit for the measurement of signals from the electrodes, and interconnecting wiring between the electrodes and the integrated circuit, is characterized in that the at least one driver electrode, the at least one sensor electrode, said signal integrated circuit and said interconnecting wiring are embedded within an integrated module.

The invention also concerns a mobile terminal, which comprises a fingerprint sensor arrangement according to the invention.

A method according to the present invention for producing a fingerprint sensor, is characterized in that the method comprises the following steps:
  providing a signal processing integrated circuit,
  providing at least one driver electrode, providing at least one sensor electrode,
encapsulating said integrated circuit, said at least one driver electrode and said at least one sensing electrode into an integrated module.

One essential idea in implementing this invention is to fabricate a capacitive fingerprint sensor into a plastic substrate with an embedded integrated circuit chip. The inventive fabrication method describes how to connect and embed an integrated circuit containing measurement electronics, to a batch processed larger scale electrode configuration that is used for capturing the capacitive image of the finger print. The inventive concept can most advantageously be realized using one or several of the following technical details:

1) Attachment of the silicon integrated circuit on a carrier substrate with interconnecting wiring;
2) Different methods for connecting the integrated circuit electrically to the carrier substrate:
   wire bonding,
   via connection using electroplated, electroless, or thin film metallization, and
   direct electrical contact from the integrated circuit to the carrier substrate (laser holes, etc.);
3) Molding of a two or three dimensional plastic structure on top of the carrier and the IC to form a substrate for the measurement electrode;
4) Deposition of the electrode metallization on top of the three dimensional structure with preferably 5-10 µm resolution, and
5) Encapsulation of the structure in plastic.

Alternatively, if the integrated circuit has a large surface, it is also possible to use an embodiment in which the electrodes and insulating/protective polymer layers are deposited directly on the integrated circuit.

It is also possible to integrate other types of sensors to the fingerprint sensor unit. For example, in one embodiment of the invention a light emitting diode and a light sensitive detector are placed on the opposite sides of the finger groove in order to measure light absorption through the finger. The wavelength of the light used is such that blood in a live finger causes maximal absorption signal. This way oxidized hemoglobin can be detected from the user's finger. Thus by this method also the heartbeat rate can be monitored. This makes the usage of any artificial fingers for identification falsification very difficult. In addition, other sensors such as temperature TS and light LS sensors can be integrated within the finger groove and embedded into the fingerprint sensor module.

The present invention offers important advantages over the prior art solutions. The fabrication process is very simplified, and the invention can be applied to existing fingerprint measurement concepts and electronics to make the fabrication of the device more cost efficient.

Due to the embedded structure the sensor structure is very secure. It is practically not possible to make any external connections to the wiring between the sensor electrodes and the signal processing circuits. Therefore there is a minimal risk of recording signals from actual finger measurements and using them fraudulently.

The invention also describes a way to create two- or three-dimensional electrode surface structures that can be used to optimize the performance of the sensor. When the at least two-dimensionally formed structure is designed to follow the shape of a finger, a very small pressure is required when sliding the finger along the sensor surface. This way the use of the sensor is ergonomic and the measurement is made very reliable.

An at least two-dimensionally formed structure of the sensor surface is preferably achieved by integrating the sensor electrodes and the measurement electronics such as ASICs into a three-dimensional module using chip-on-flex technology. The chip-on-flex technology is based e.g. on the use of flexible Kapton® film as the substrate for wiring and attachment of sensor and ASIC chips. The integrated circuits and sensors are protected using molded polymer cover on top. When using the flexible circuit board for the creation of 2D or 3D structures the sensors and electronics can be a part of the device case.

Preferred embodiments of the invention are described below.

BRIEF DESCRIPTION OF THE DRAWINGS

Next the invention will be described in greater detail with reference to exemplary embodiments in accordance with the accompanying drawings, in which
FIG. 1A illustrates using a capacitive fingerprint sensor,
FIG. 1B illustrates the operating principle of a prior art capacitive fingerprint sensor,
FIG. 2 illustrates a block diagram describing the measurement of skin impedance using active guarding.

DETAILED DESCRIPTION

FIGS. 1A, 1B and 2 were explained above in the description of prior art.

Figure 3:
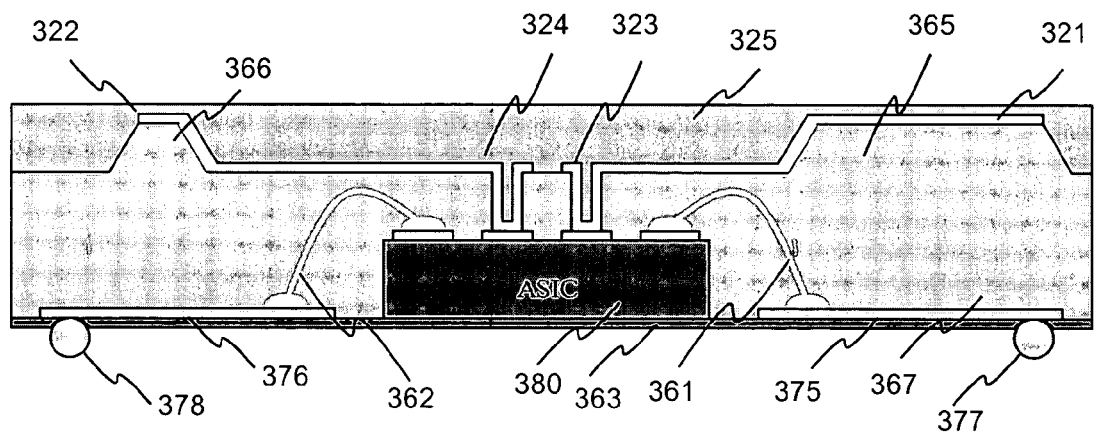
FIG. 3 illustrates a cross section of an exemplary arrangement according to the invention, in which wire bonding is applied between a substrate and an ASIC.

FIG. 3 illustrates a cross section of an exemplary arrangement according to the invention. The arrangement comprises a substrate 363, which is e.g. Kapton® film. The ASIC processing/measurement circuit 380 is attached on the carrier 363. The unit is connected to a printed circuit board by soldering from its soldering balls 377 and 378. The ASIC circuit is coupled electrically to the soldering balls by wire bonding 361, 362 to metallizations 375, 376 on the substrate. The driver electrode 321 and the sensing electrodes 322 are connected to the ASIC circuit with wires made by metallizations and vias, 323 and 324. The electrodes are made closer to the surface of the unit by producing polymer bumps 365 and 366 to the microreplicated polymer layer 367. The thickness of the bumps is e.g. 100-200 µm. On top of the unit there is encapsulation 325.

Figure 4:
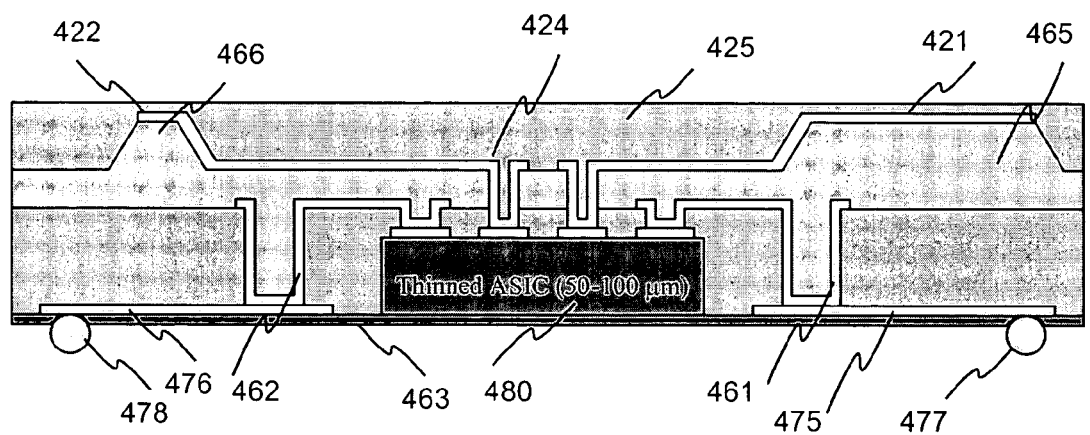
FIG. 4 illustrates a cross section of an exemplary arrangement according to the invention, in which metallization connection is applied between a substrate and an ASIC.

FIG. 4 illustrates a cross section of another exemplary arrangement according to the invention. The arrangement is similar with the previous embodiment of FIG. 3, but the contacts from the ASIC to the soldering balls are made with metal film connection vias 461, 462 to the printed metallizations 475, 476 of the substrate. This arrangement requires a thinned ASIC circuit so that the vias 461, 462 do not need to be very deep.

Figure 5:
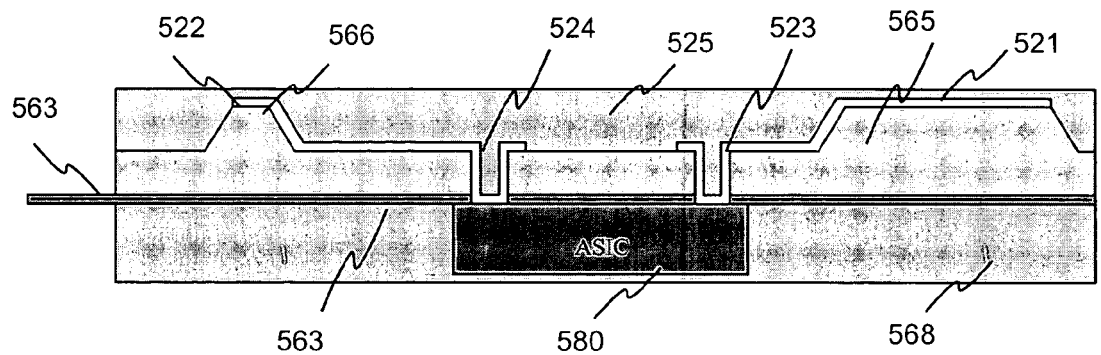
FIG. 5 illustrates a cross section of an exemplary arrangement according to the invention, in which an ASIC and electrodes are located on opposite sides of a substrate.

FIG. 5 illustrates a cross section of a third exemplary arrangement according to the invention. The arrangement is similar with the previous embodiments, but in this arrangement the ASIC is electrically coupled directly to a flexible substrate or "flex" 563. The electrodes 521, 522 and the ASIC 580 are on opposite sides of the substrate. The electrodes are connected to the ASIC with vias 523, 524, which extend to the surface of the ASIC through holes on the substrate. The unit is preferably connected to other electronics with a connector at the end of the flex 563. The flexible substrate is preferably Kapton® film.

Figure 6:
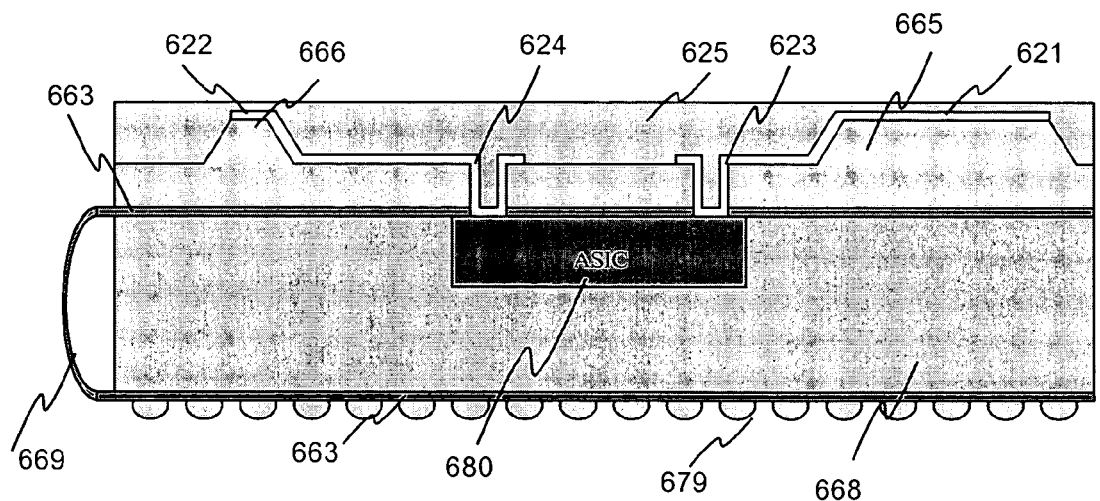
FIG. 6 illustrates a cross section of an exemplary arrangement according to the invention, in which a flexible substrate is bent to serve as a surface for electrical connections of the unit.

FIG. 6 illustrates a cross section of a fourth exemplary arrangement according to the invention. The arrangement is similar with the previous embodiment of FIG. 5, but in this arrangement the unit is soldered to other electronics. This is achieved by bending 669 and attaching the flex 663 under the unit, and further connecting soldering balls 679 to the flex 663. The layers 625 and 668 are produced by encapsulation.

Figure 7A:
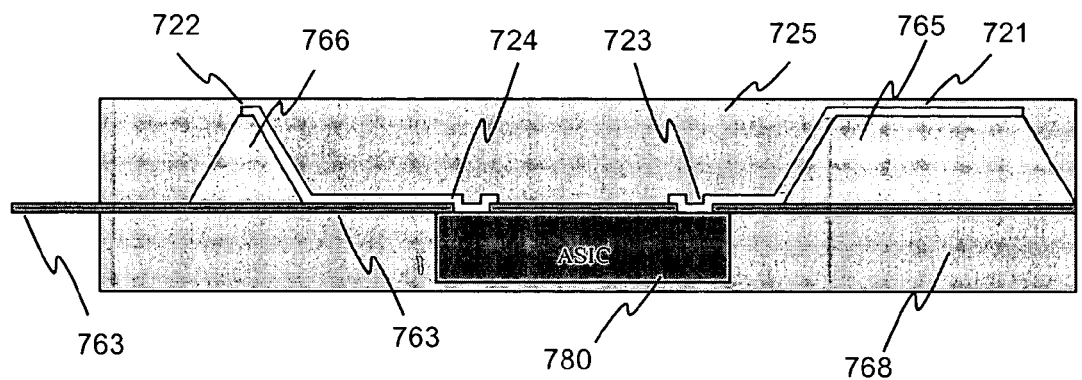
FIG. 7A illustrates a cross section of an exemplary arrangement according to the invention, in which metallizations between the ASIC and the electrodes are located on the substrate.
Figure 7B:
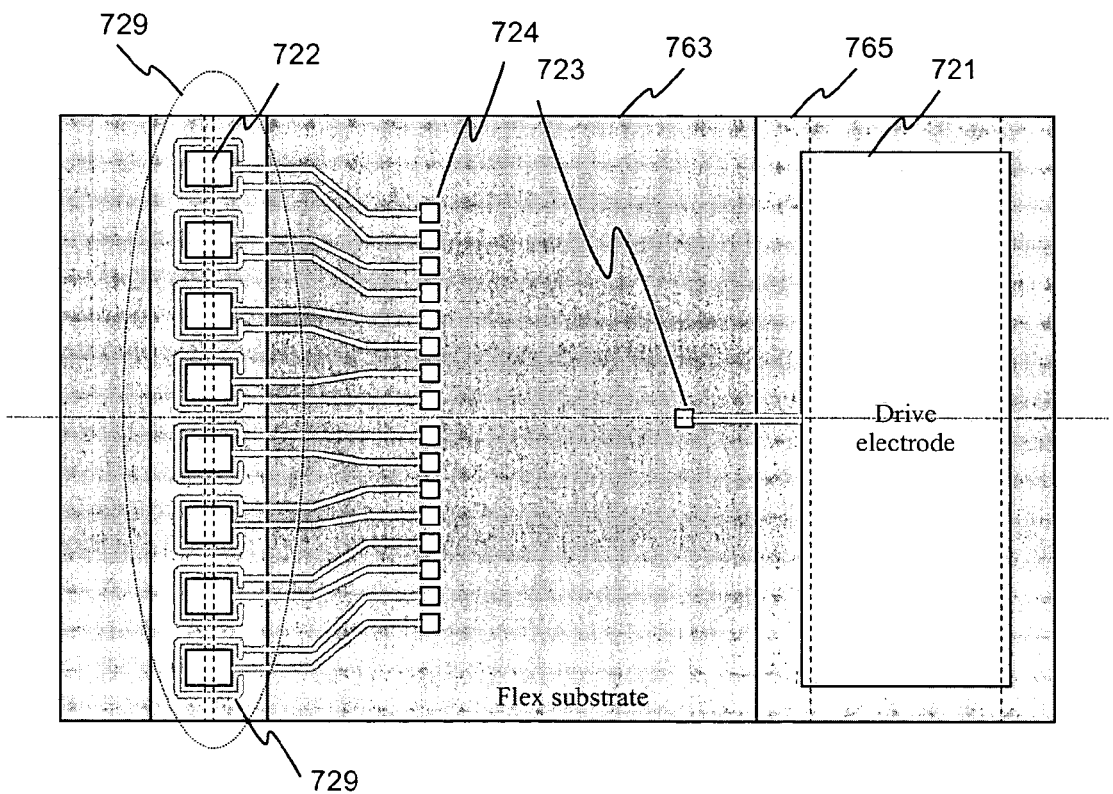
FIG. 7B illustrates a top view of an exemplary arrangement according to the invention, in which metallizations between the ASIC and the electrodes are located on the substrate and in which guard rings are used.

FIG. 7A illustrates a cross section of a fifth exemplary arrangement according to the invention. The arrangement is similar with the previous embodiment of FIG. 5, but in this arrangement the metallizations 723, 724 between the ASIC 780 and the electrodes 721, 722 are located on the flex substrate 763 thus avoiding one layer of microreplicated polymer and reducing the depth of the vias. FIG. 7B illustrates a top view of the arrangement shown in FIG. 7A, without the top capsulation. FIG. 7B shows the drive electrode 721, which is located on the polymer layer 765. The driver electrode is connected through the via 723 to the ASIC. The Figure also shows the array of sensing electrodes 722 with guard rings 729. The sensing electrodes and guard rings are wired by metallizations to array of the vias 724.

Figure 8:
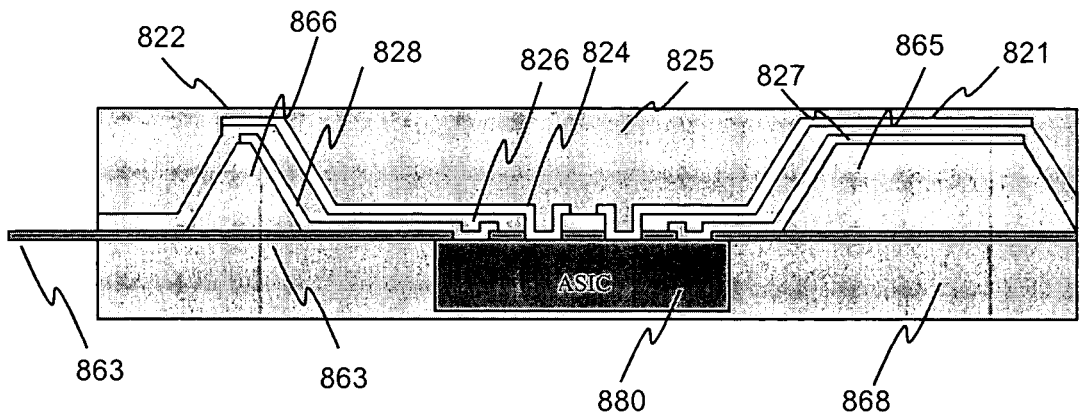
FIG. 8 illustrates a cross section of an exemplary arrangement according to the invention, in which different metallized layers are used for electrodes and guard rings

FIG. 8 illustrates a cross section of a sixth exemplary arrangement according to the invention. The arrangement is similar with the previous embodiment of FIG. 7, but in this arrangement there are guard electrodes 827, 828 under the sensing electrode metallizations. The guard electrodes and sensing electrodes are both connected to the ASIC with vias, 826, 824.

Figure 9:
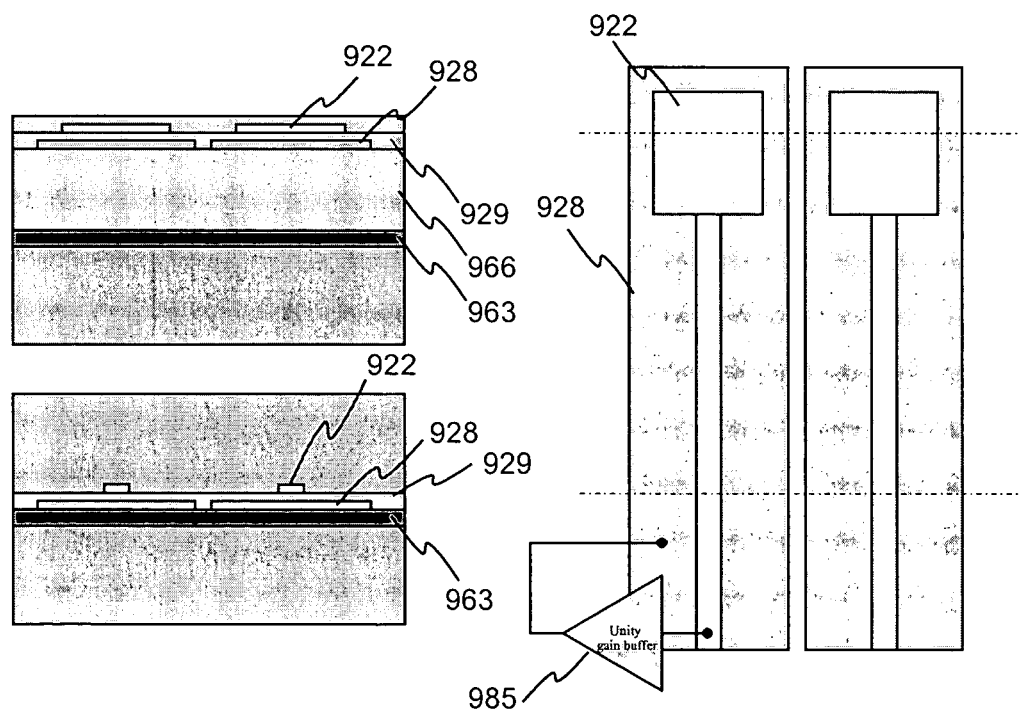
FIG. 9 illustrates further cross sections and a top view of an exemplary arrangement according to the invention, in which different metallized layers are used for electrodes and guard rings

FIG. 9 illustrates top and cross section views of exemplary sensing electrodes 922 and guard electrodes 928 on a substrate 963. The guard electrodes 928 are located under the sensing electrodes 922 with an insulating layer 929 between the electrodes. In this embodiment the guard electrodes have larger surface. A buffer amplifier 985 keeps the guard electrodes in the same potential as the sensor electrodes and thus the sensor electrodes are less loaded by the adjacent materials, or interference.

Figure 10:
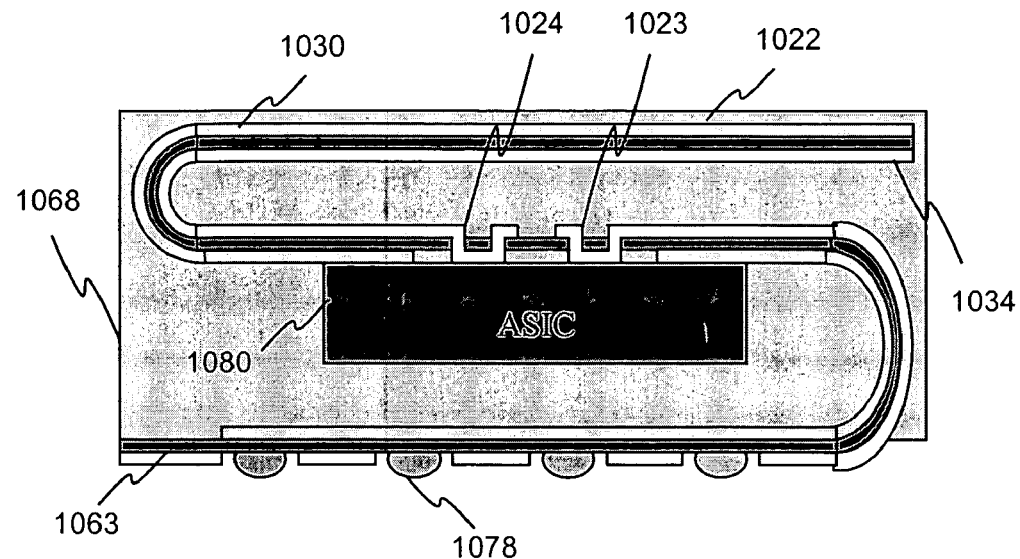
FIG. 10 illustrates a cross section of an exemplary arrangement according to the invention, in which a flexible substrate is bent to serve as electrodes and a surface for electrical connections of the unit.

FIG. 10 illustrates a further modification of an arrangement where the connection to other electronics is made by bending a flexible printed wired board (PWB) or film substrate 1063 to under the unit, and attaching soldering balls 1078 to the flex. In this embodiment the other end of the flex is bent above the unit in order to use the other end of the flex as electrodes. The wiring to the electrodes 1022 and to the soldering balls 1078 is provided using two-sided metallization 1030, 1034 of the flex film and vias 1023, 1024. On the electrode end of the flex one metallized surface 1030 serves as sensing electrode and the second metallized surface 1034 of the flex serves as a guard electrode. This construction enables a two- or three-dimensional form of the electrode-finger interface.

Figure 11:
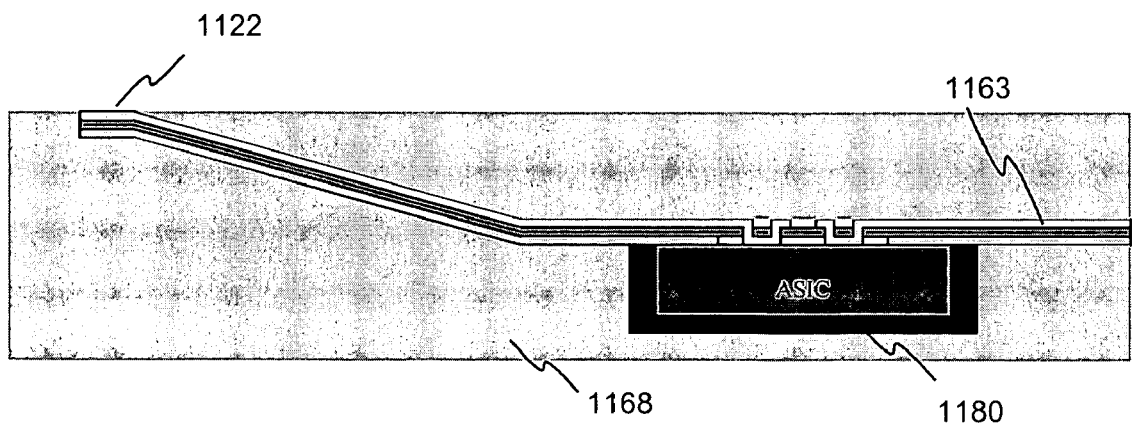
FIG. 11 illustrates cross section of a further exemplary arrangement according to the invention, in which a flexible substrate is applied to serve as a surface for electrical connections of the unit.

FIG. 11 illustrates another embodiment where one end of a flexible printed, wired substrate is used for electrodes 1122, and other part of the flex 1163 for external connection. The connections between the metallized surfaces and the ASIC 1180 can be made similar to the embodiment of FIG. 10. This construction also enables a two- or three-dimensional form of the electrode-finger interface. This arrangement can be directly molded into a cover 1168 of e.g. mobile phone.

Figure 12:
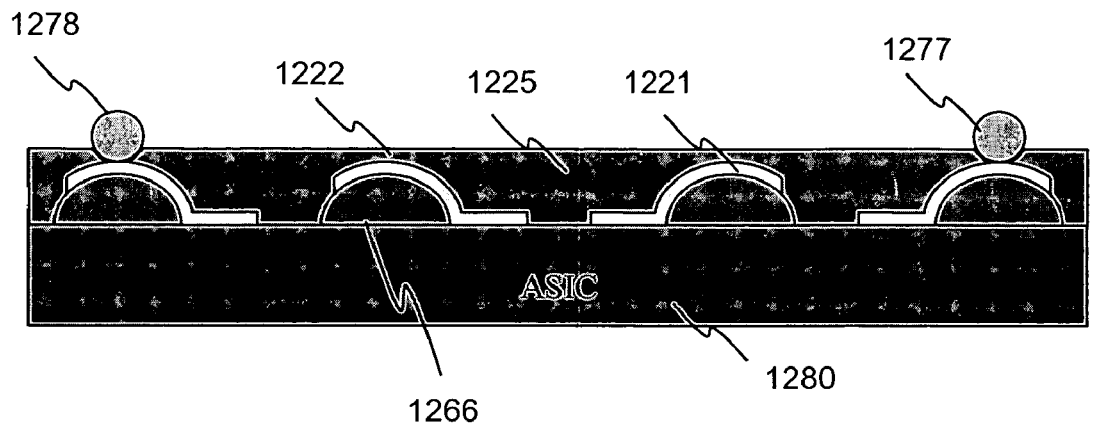
FIG. 12 illustrates a cross section of an exemplary arrangement according to the invention, in which electrodes and external connections are provided directly on an ASIC.

FIG. 12 illustrates a cross section of a further exemplary arrangement according to the invention. In this case the ASIC circuit 1280 is large with respect to the needed electrode structure, and therefore it is possible to create a two- or three-dimensional form of the electrode structure directly on the ASIC. The sensing electrodes 1222 and the driver electrode 1221 are produced on polymer bumps 1266. The connections to the soldering balls 1277 and 1278 are also made using similar polymer bumps and metallizations. There is a protecting polymer layer 1225 on the ASIC and electrodes.

Figure 13:
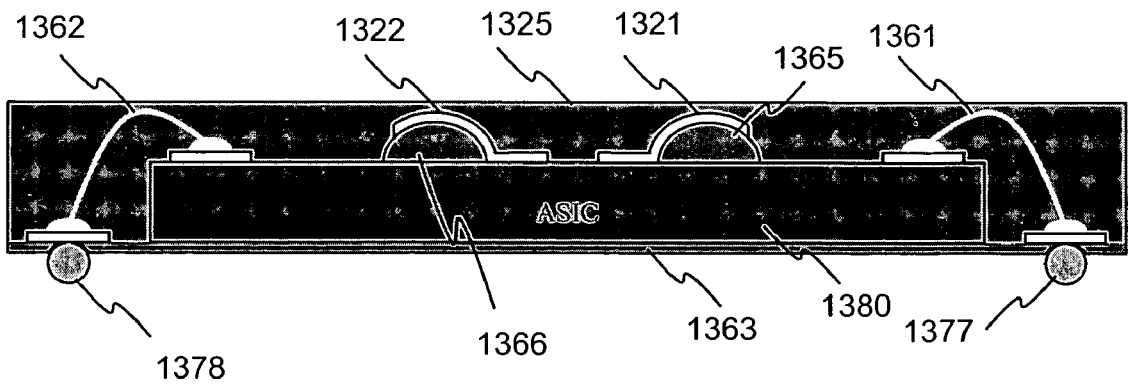
FIG. 13 illustrates a cross section of an exemplary arrangement according to the invention, in which electrodes are provided directly on an ASIC, and wire bonding is used between the ASIC and a substrate.

FIG. 13 illustrates a cross section of a still further exemplary arrangement according to the invention. This embodiment is similar to the arrangement of FIG. 12, but in this arrangement there is a substrate 1363 and bonding wires 1361, 1362 for creating connections from the ASIC 1280 to the metallized pads of the substrate 1363 and the soldering balls 1377, 1378.

Figure 14:
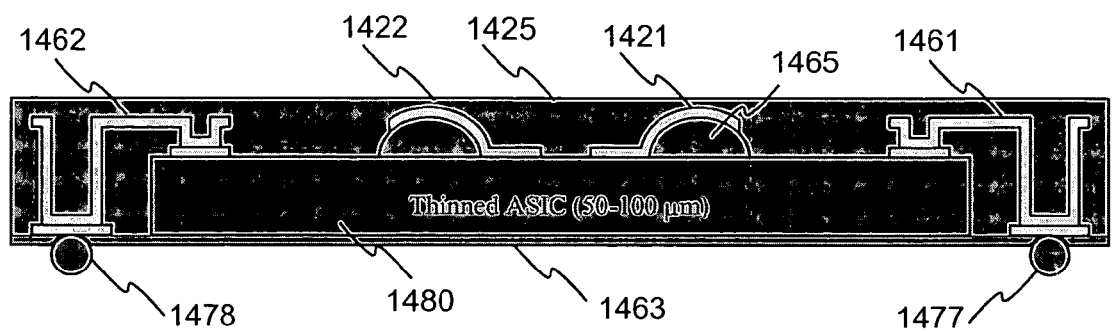
FIG. 14 illustrates a cross section of an exemplary arrangement according to the invention, in which electrodes are provided directly on an ASIC, and metallized connections are used between the ASIC and a substrate.

FIG. 14 illustrates a cross section of a further exemplary arrangement according to the invention. This embodiment is similar to the arrangement of FIG. 13, but instead of bonding wires the connections 1461, 1462 between the ASIC 1480 and the substrate 1463 are made using metallization.

Figure 15:
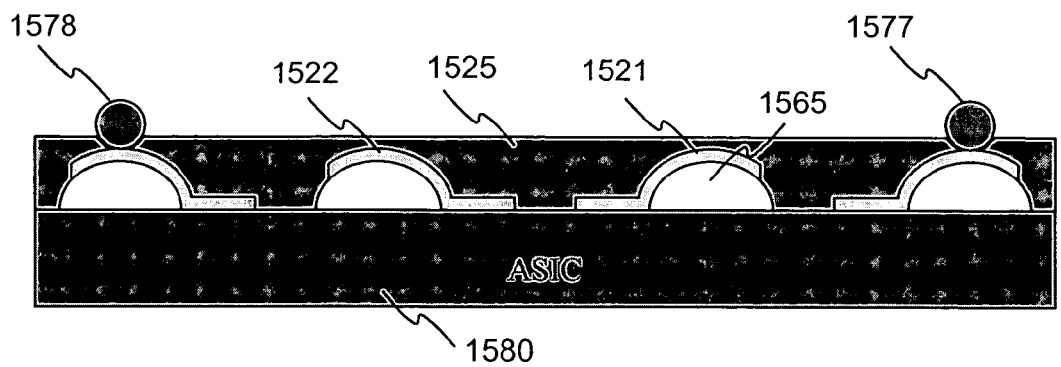
FIG. 15 illustrates a cross section of an exemplary arrangement according to the invention, in which electrodes and external connections are provided directly on an ASIC using metallization of grooves in a polymer.

FIG. 15 illustrates a cross section of a further exemplary arrangement according to the invention. This embodiment is similar to the arrangement of FIG. 12, but this embodiment includes a polymer layer 1525 with preferably 100-150 µm deep grooves 1565. The soldering balls 1577, 1578 are first attached to holes in the polymer, and metallizations 1521, 1522 that form the electrodes are made on the grooves in the opposite side of the polymer. The polymer substrate 1525 is then attached on the ASIC, 1580.

Figure 16A:
FIG. 16A illustrates cross sections of a production sample after phases 160-164 in an exemplary process to produce a unit according to the invention, wherein small ASIC is used.
Figure 16A:
Figure 16A:
Figure 16A:
Figure 16A:
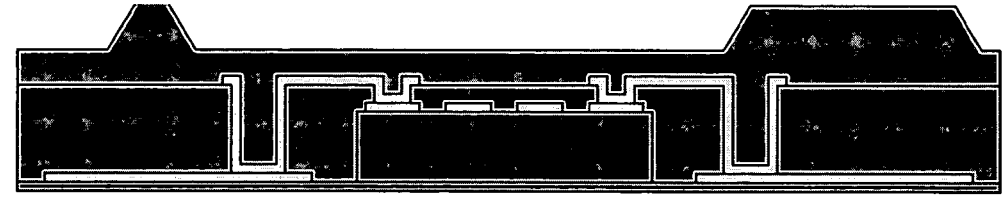
Figure 16B:
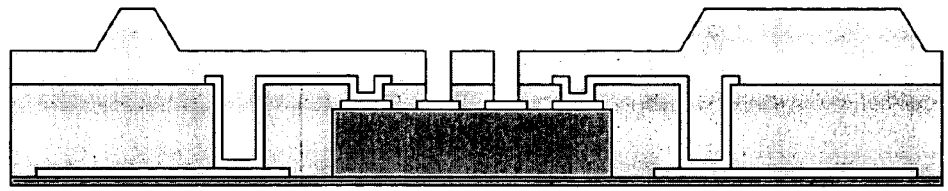
FIG. 16B illustrates cross sections of a production sample after phases 165-169 in an exemplary process to produce a unit according to the invention.
Figure 16B:
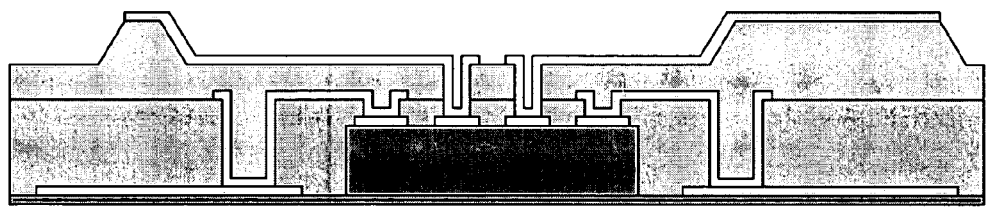
Figure 16B:
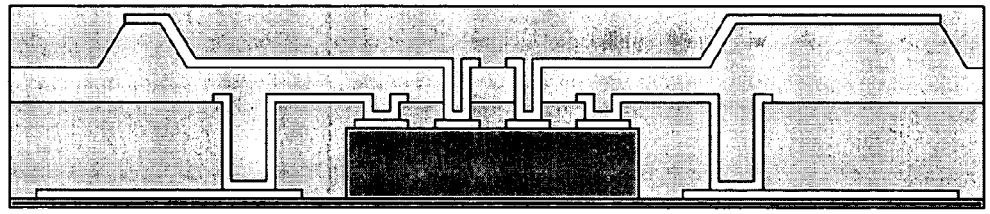
Figure 16B:
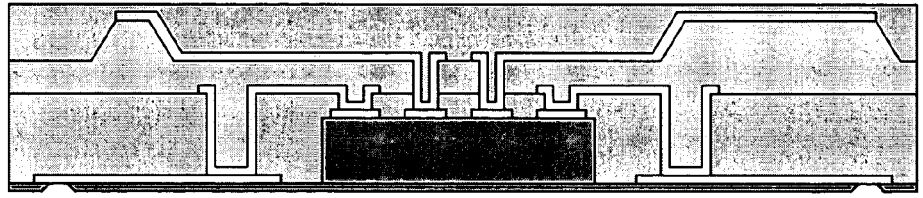
Figure 16B:
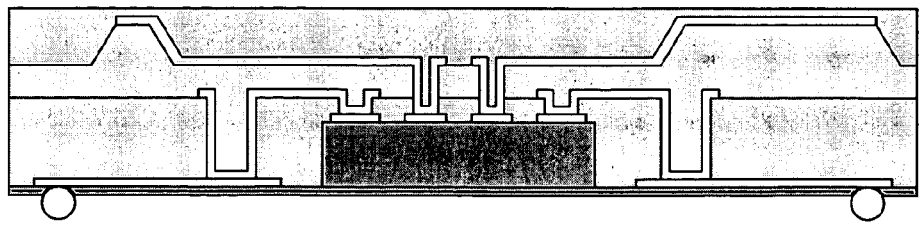

FIGS. 16A and 16B illustrate an exemplary process for manufacturing a unit of FIG. 4 according to the invention. The Figures show a cross section of the unit to be manufactured after the concerned manufacturing phase has been executed. First in phase 160 an ASIC circuit is glued on a flexible substrate that includes wiring. The ASIC is preferably a thinned type component with height of only 50-100 µm. The flex sheet substrate may be large for attachment of several components. In step 161 a polymer layer is cast on top of the attached ASIC. In step 162 vias are opened through the polymer layer until the wiring of the flex substrate and to the ASIC pads. The metallization is then electroplated and patterned in step 163. The polymer layer is injection molded using micro replicated mold, step 164.

Next illustrated in FIG. 16B, vias are opened through the polymer layer to the ASIC pads in step 165. This may also be made by cavity molding during the previous step. In step 166 the electroplated metallization is patterned to form the electrode structure. A protective polymer layer is cast on top of the device in step 167. The solder areas of the substrate are then opened, step 168, and finally the solder bumps are processed and diced in step 169.

Figure 17A:
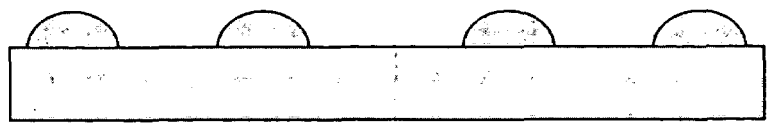
FIG. 17A illustrates cross sections of a production sample after phases 170-174 in an exemplary process to produce a unit according to the invention, wherein a large ASIC is used.
Figure 17A:
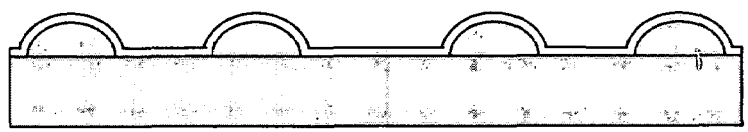
Figure 17A:
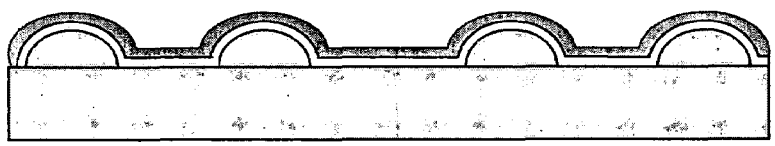
Figure 17A:
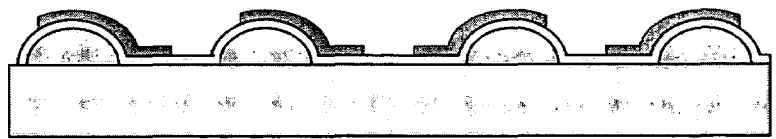
Figure 17A:
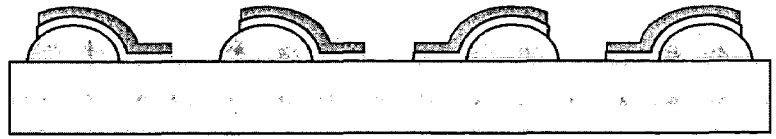
Figure 17B:
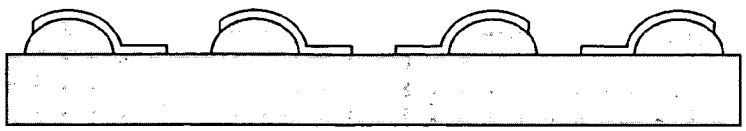
FIG. 17B illustrates cross sections of a production sample after phases 175-179 in an exemplary process to produce a unit according to the invention.
Figure 17B:
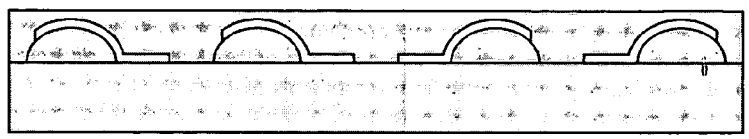
Figure 17B:
Figure 17B:
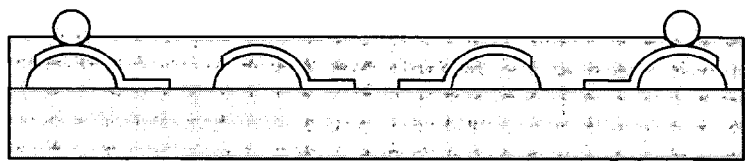
Figure 17B:
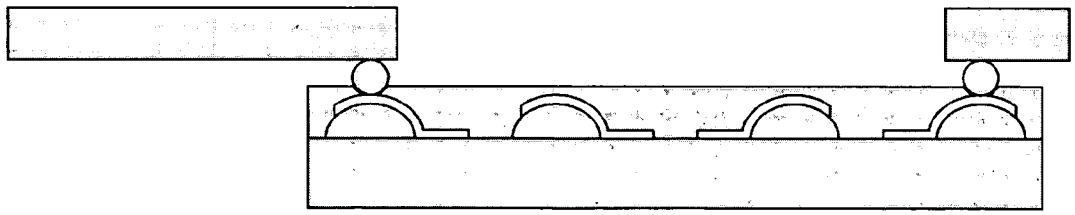

FIGS. 17A and 17B illustrate another exemplary process, which is for manufacturing a unit of FIG. 12 according to the invention. First in phase 170 two or three dimensionally formed structures are fabricated on top of the ASIC surface with roughly 100-200 µm of height. The thin film metallization is deposited on top of the ASIC and the 3D polymer structures in phase 171. The metallization can be made using e.g. Cr—Au. In step 172 a photoresist is electroplated on top of the metallization. The photoresist is then patterned, step 173, and the metal layers are etched in step 174.

Next illustrated in FIG. 17B the photoresist is removed in step 175. A protective polymer layer is cast in step 176, and contact areas are opened for the flip-chip process, step 177. The soldering balls are then attached with flip-chip bump process in step 178, and finally the produced unit is attached to a cover, step 179.

The invention has been explained above with reference to the aforementioned embodiments, and several industrial advantages of the invention have been demonstrated. It is clear that the invention is not only restricted to these embodiments, but comprises all possible embodiments within the spirit and scope of the inventive thought and the following patent claims. For example, the inventive idea of the authentication arrangement is not restricted to be used in mobile terminals, but it can be applied also in many other components and purposes. The invention is not either restricted to use of the mentioned materials.

The invention claimed is:

1. A fingerprint sensor arrangement comprising at least one driver electrode and at least one sensor electrode for a capacitive measurement, and an integrated signal processing circuit for the measurement of signals from the electrodes, and interconnecting wiring between the electrodes and the integrated circuit, wherein the arrangement further comprises a substrate of flexible material that forms at least part of said sensor, and the at least one driver electrode, the at least one sensor electrode, said signal integrated circuit and said interconnecting wiring are embedded within an integrated module and wherein said interconnecting wires are metallizations between polymer layers, and said at least one driver electrode and/or said at least one sensor electrode is metallization between polymer layers.

2. An arrangement according to claim 1, characterized in that said electrode and said integrated circuit are coupled with a substrate, the substrate comprising said wiring between the electrodes and the integrated circuit.

3. An arrangement according to claim 2, characterized in that the substrate comprises the at least one driver electrode, said at least one sensor electrode, or both.

4. An arrangement according to claim 2, characterized in that said substrate is a flexible film.

5. An arrangement according to claim 1, characterized in that it comprises a substrate comprising wiring for an external connection to the integrated circuit.

6. An arrangement according to claim 5, characterized in that it comprises wire bonding between the integrated circuit and wiring of the substrate.

7. An arrangement according to claim 5, characterized in that it comprises metallization between the integrated circuit and wiring of the substrate.

8. An arrangement according to claim 1, characterized in that it comprises guard rings in the vicinity of the at least one driver electrode, in the vicinity of at least one sensor electrode, or both.

9. An arrangement according to claim 8, characterized in that said guard ring is metallization and the arrangement comprises an insulating polymer layer between the guard ring metallization and the sensor electrode.

10. An arrangement according to claim 1, characterized in that said integrated module is encapsulated with injection molded polymer.

11. An arrangement according to claim 1, characterized in that the surface of said sensor has a curved form in at least two dimensions.

12. An arrangement according to claim 11, characterized in that said form approximates the form of a finger.

13. An arrangement according to claim 1, characterized in that the arrangement comprises a bump for elevating the electrodes.

14. An arrangement according to claim 13, characterized in that said bump is a layer of polymer.

15. An arrangement according to claim 1, characterized in that said sensor comprises one driver electrode and a row of sensing electrodes.

16. An arrangement according to claim 15, characterized in that said measurement circuit is adapted to measure successive signals while the finger moves in a perpendicular direction in relation to said row of sensing electrodes, for providing a two dimensional matrix of capacitive measurement results from the finger.

17. An arrangement according to claim 1, characterized in that the arrangement further comprises a infrared light source, a infrared light detector and second measurement means for measuring absorption of infrared light from the finger.

18. An arrangement according to claim 1, characterized in that said arrangement further comprises a temperature sensor for measuring the temperature from the finger.

19. An arrangement according to claim 1, characterized in that said arrangement further comprises a humidity sensor for sensing humidity of the finger.

20. A mobile terminal, characterized in that it includes a fingerprint sensor arrangement according to claim 1.

21. A method for producing a fingerprint sensor, comprising: providing a signal processing integrated circuit, providing at least one driver electrode wherein a substrate of flexible material forms at least part of said sensor electrode, providing at least one sensor electrode, encapsulating said integrated circuit, said at least one driver electrode and said at least one sensing electrode into an integrated module and wherein said interconnecting wires are metallizations between polymer layers, and said at least one driver electrode and/or said at least one sensor electrode is metallization between polymer layers.

22. A method according to claim 21, characterized in that said step of encapsulating comprises a step of encapsulating into polymer.

23. A method according to claim 21, characterized in that said step of providing said at least one driver electrode comprises a step of metallization.

24. A method according to claim 21, characterized in that said step of providing said at least one sensing electrode comprises a step of metallization.

25. A method according to claim 21, characterized in that the method comprises the step of providing at least one guard ring in the vicinity of at said least one sensor electrode.

26. A method according to claim 25, characterized in that the step of providing at least one guard ring comprises a step of metallization.

27. A method according to claim 25, characterized in that it comprises a step of providing an insulating polymer layer between said at least one guard ring and said at least one sensing electrode.

28. A method according to claim 21, characterized in that it comprises a step of providing a substrate and connecting said integrated circuit on said substrate before said encapsulating.

29. A method according to claim 28, characterized in that the method comprises a step of providing an aperture in said substrate for providing an electrical connection through the substrate.

30. A method according to claim 21, characterized in that the method comprises a step of providing an elevating bump between said substrate and the electrodes.

31. A method according to claim 30, characterized in that said bump is made of a layer of polymer.

32. A method according to claim 28, characterized in that said substrate is flexible and includes wiring.

33. A method according to claim 32, characterized in that an end of said flexible substrate is used for an electrically connecting external circuits to the fingerprint sensor.

34. A method according to claim 32, characterized in that wiring of said flexible substrate is used for providing said at least one sensing electrode, for providing said at least one driving electrode, or both.

35. A method according to claim 21, characterized in that said at least one sensing electrode, or said at least one driving electrode, or both are provided with metallization on the surface of the integrated circuit.

36. A method according to claim 28, characterized in that an electrical connection is provided by wire bonding between the integrated circuit and wiring of the substrate.

37. A method according to claim 28, characterized in that an electrical connection is provided by metallization between the integrated circuit and wiring of the substrate.

38. A method according to claim 21, characterized in that conductive bumps are connected with a flip chip process to a metallization of a substrate or the integrated circuit for providing external electrical connections to the integrated circuit.

39. A method according to claim 21, characterized in that a polymer layer is provided by injection molding using micro replicated mold.

40. A method according to claim 21, characterized in that the process comprises the steps of providing polymer layers and at least one metallization layer one upon the other.

41. A method according to claim 21, characterized in that the fingerprint sensor is embedded into an equipment cover.

* * * * *

UNITED STATES PATENT AND TRADEMARK OFFICE
CERTIFICATE OF CORRECTION

PATENT NO. : 7,606,400 B2
APPLICATION NO. : 10/763821
DATED : October 20, 2009
INVENTOR(S) : Ryhänen et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1577 days.

Signed and Sealed this

Twelfth Day of October, 2010

David J. Kappos
*Director of the United States Patent and Trademark Office*